United States Patent
Kitaji

(10) Patent No.: US 9,754,393 B2
(45) Date of Patent: Sep. 5, 2017

(54) DISPLAY APPARATUS, DISPLAY SYSTEM AND DISPLAY METHOD

(71) Applicant: KYOCERA CORPORATION, Kyoto (JP)

(72) Inventor: Mitsuhiro Kitaji, Yokohama (JP)

(73) Assignee: KYOCERA CORPORATION, Kyoto (JP)

( * ) Notice: Subject to any disclaimer, the term of this patent is extended or adjusted under 35 U.S.C. 154(b) by 321 days.

(21) Appl. No.: 14/401,235

(22) PCT Filed: May 15, 2013

(86) PCT No.: PCT/JP2013/063574
§ 371 (c)(1),
(2) Date: Nov. 14, 2014

(87) PCT Pub. No.: WO2013/172384
PCT Pub. Date: Nov. 21, 2013

(65) Prior Publication Data
US 2015/0138204 A1    May 21, 2015

(30) Foreign Application Priority Data

May 17, 2012 (JP) ................. 2012-113869

(51) Int. Cl.
*G06T 11/20* (2006.01)
*H02J 3/38* (2006.01)
(Continued)

(52) U.S. Cl.
CPC .......... *G06T 11/206* (2013.01); *G01R 11/00* (2013.01); *H02J 3/381* (2013.01); *H02J 13/001* (2013.01)

(58) Field of Classification Search
CPC ..... Y02E 60/50; Y02E 60/525; Y02E 10/563; Y02E 10/566; B60L 2230/16; B60L 3/12;
(Continued)

(56) References Cited

U.S. PATENT DOCUMENTS

2003/0120370 A1    6/2003  Kitayama et al.
2004/0225648 A1*  11/2004  Ransom ................. G01D 4/004
(Continued)

FOREIGN PATENT DOCUMENTS

JP    2003-189471 A    7/2003
JP    2006-014533 A    1/2006
(Continued)

OTHER PUBLICATIONS

Extended European Search Report dated Dec. 17, 2015 issued by the European Patent Office for Counterpart European Application No. EP 13791127.7.
(Continued)

*Primary Examiner* — Haixia Du
(74) *Attorney, Agent, or Firm* — Procopio Cory Hargreaves and Savitch LLP

(57) ABSTRACT

In the present invention, in a coordinate plane that receives an expression according to a first axis indicating a parameter that impacts a basic rate and a second axis indicating a parameter that impacts a metered power rate, a display unit (230) displays an image indicating coordinates indicating the use state of power received from a grid.

13 Claims, 7 Drawing Sheets

(51) Int. Cl.
*G01R 11/00* (2006.01)
*H02J 13/00* (2006.01)

(58) Field of Classification Search
CPC .......... H04N 1/00034; H04N 1/00344; H04N 1/00477; H04N 21/4436; Y02T 10/7275; Y02T 10/72; Y02T 10/7283; Y02T 90/163
See application file for complete search history.

(56) References Cited

U.S. PATENT DOCUMENTS

| | | | |
|---|---|---|---|
| 2008/0229226 A1* | 9/2008 | Rowbottom ....... | H05B 37/0245 715/771 |
| 2009/0142930 A1* | 6/2009 | Hammond, IV .. | H01J 37/32091 438/711 |

FOREIGN PATENT DOCUMENTS

| | | |
|---|---|---|
| JP | 2010-237119 A | 10/2010 |
| WO | 2008-112181 A2 | 9/2008 |

OTHER PUBLICATIONS

International Search Report; PCT/JP2013/063574; Aug. 27, 2013.

* cited by examiner

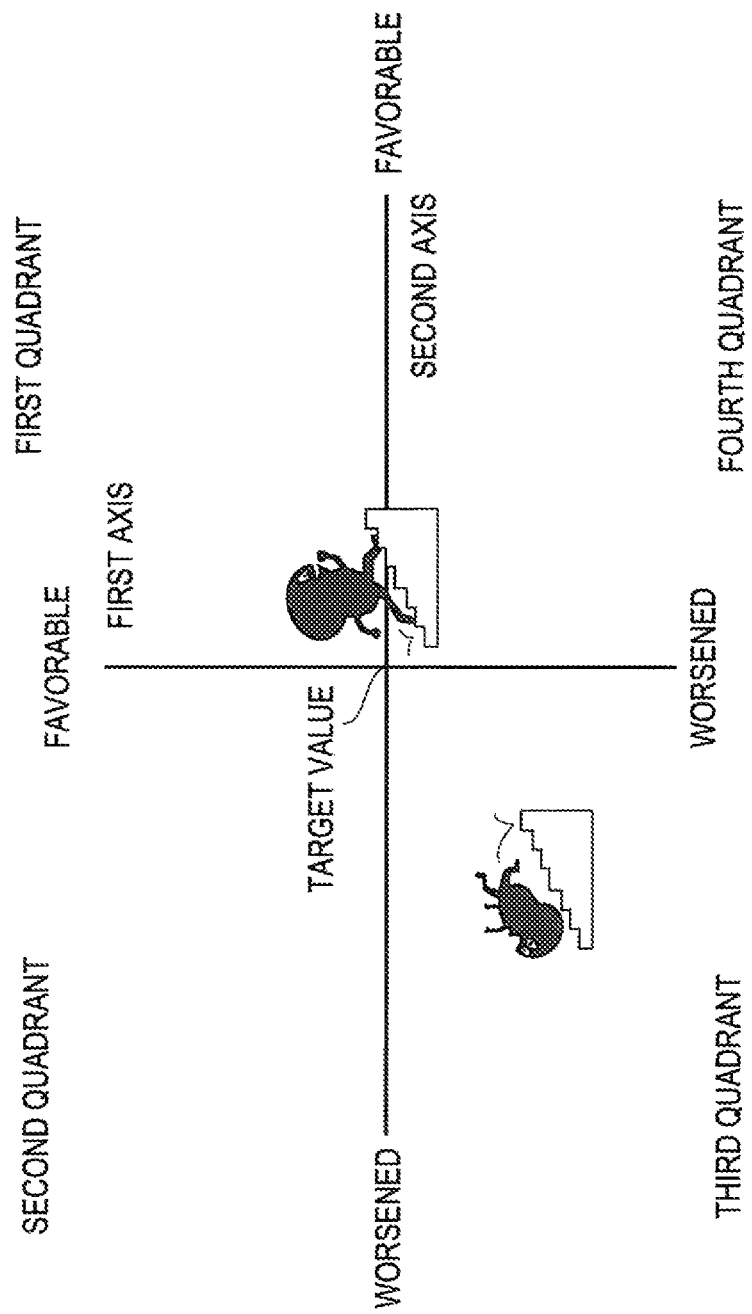

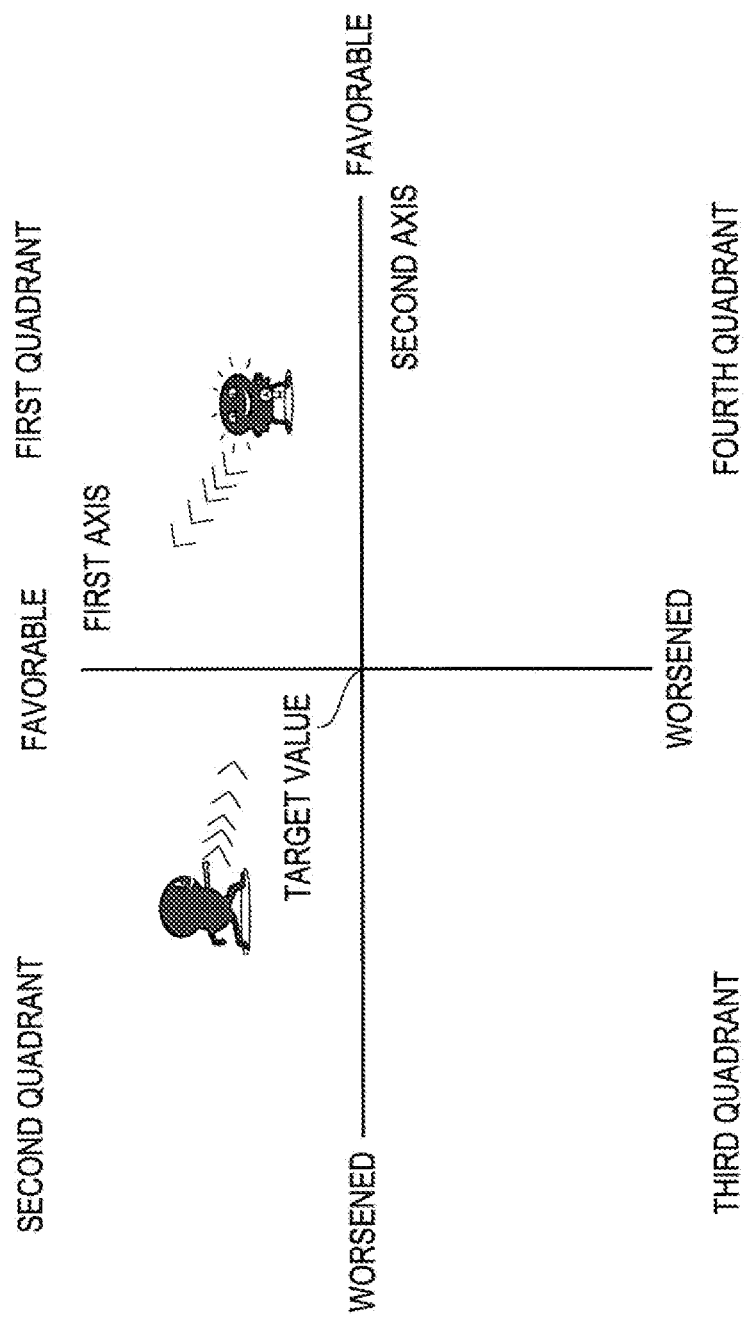

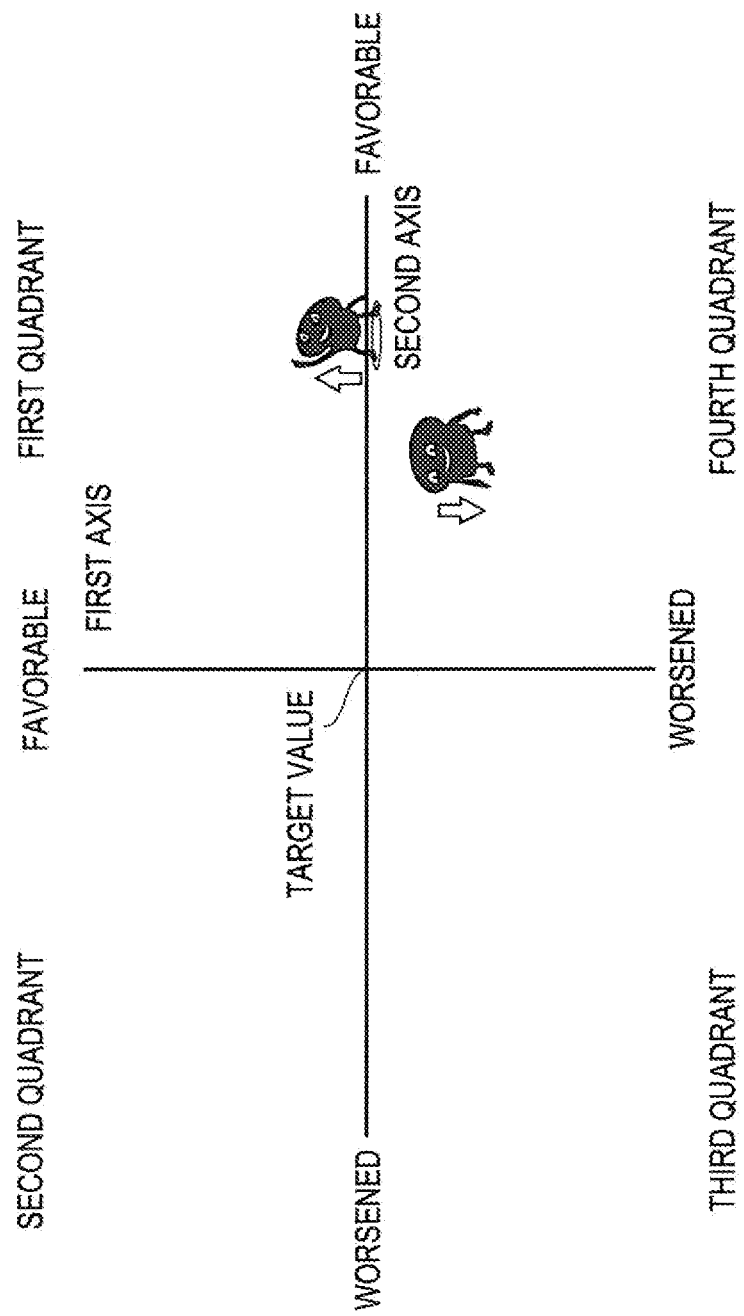

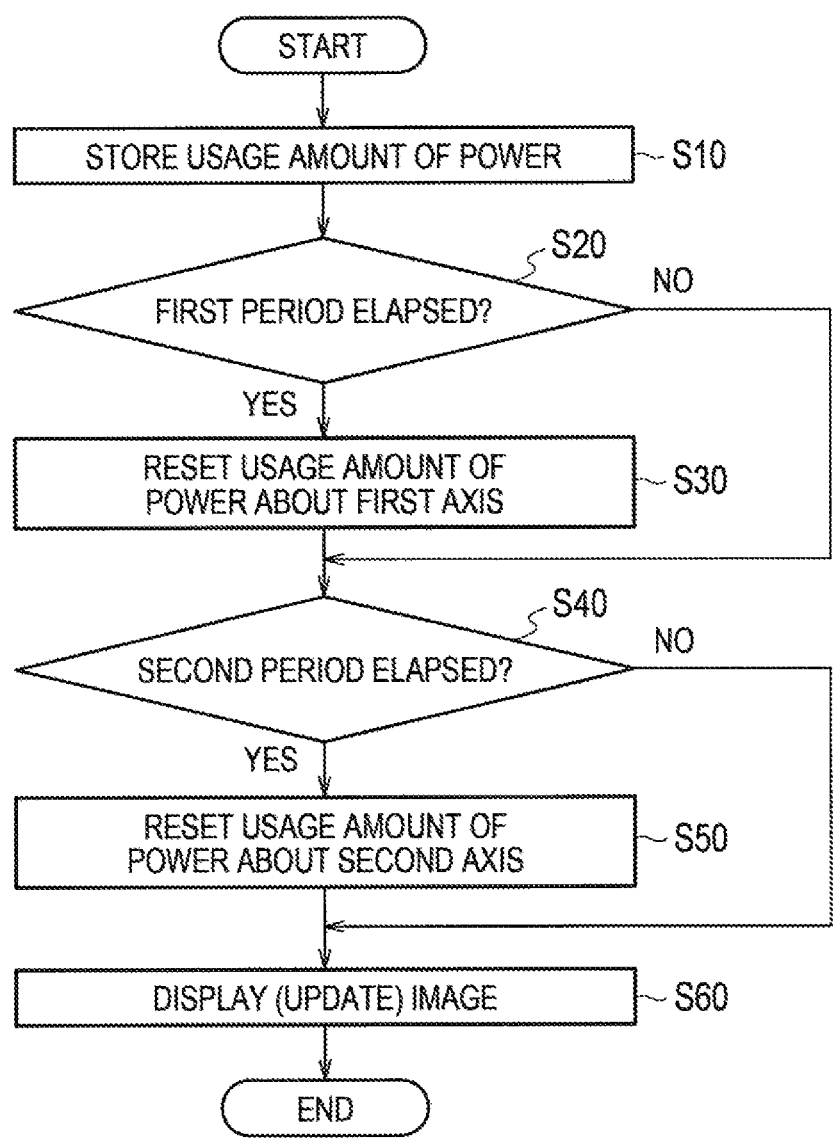

DISPLAY APPARATUS, DISPLAY SYSTEM AND DISPLAY METHOD

TECHNICAL FIELD

The present invention relates to a display apparatus, a display system and a display method for displaying a usage status of power supplied from a grid.

BACKGROUND ART

Recently, an energy management system provided with a power generating apparatus, such as a solar cell and a wind power generating apparatus, has been known.

By the way, although greatly influenced by a power condition of each country, in Japan, for example, the total power rate of a high-voltage power user is defined by a basic rate and a metered power rate. The basic rate is defined based on a peak amount of power in a prescribed period (for example, 30 minutes) in the past. On the other hand, the metered power rate is defined based on the usage amount of power in a calculation target period. A method for determining the power rate in Japan is described in, for example, Patent Literature 1.

CITATION LIST

Patent Literature

[Patent Literature 1] Japanese Patent Application Publication No. 2010-237119

SUMMARY OF INVENTION

In such a method to determine the power rate, a high-voltage power user, who considers operating their equipment in consideration of the power rate, may want to know a usage condition of power with respect to the current power rate. However, since a system itself for determining the power rate is complicated, knowing the state takes time. Further, even not a high-voltage power user in Japan, the same is true to users who are receiving power supply from power companies having the same rate determining systems.

Then, the present invention has been made to solve the above-described problems and has an object to provide a display apparatus, a display system and a display method capable of providing appropriate information in a simple manner to a power customer.

A display apparatus according to a first feature displays a usage status of power supplied from a grid. The display apparatus includes: a display unit that displays an image of a coordinate indicating a current usage status of power supplied from the grid on a coordinate plane expressed by a first axis and a second axis. The first axis is an axis indicating a parameter which affects a basic rate and indicating amount of power supplied from the grid in a first period. The second axis is an axis indicating a parameter which affects a metered power rate and indicating amount of power supplied from the grid in a second period which is different from the first period.

In the first feature, a period of the second period is selectable, and the display unit displays a usage amount of power in the period selected as the second period using the second axis.

In the first feature, the display unit displays an image illustrating a transition of the amount of power supplied from the grid based on a history of the power supplied from the grid.

In the first feature, the display unit displays the coordinate plane so as to provide different colors for a portion corresponding to a first quadrant and a portion corresponding to a third quadrant on the coordinate plane at the least.

In the first feature, the first axis and the second axis cross each other on a coordinate which indicates a first target value of the amount of power supplied from the grid in the first period and a second target value of the amount of power supplied from the grid in the second period.

In the first feature, a straight line which indicates the first target value of the amount of power supplied from the grid in the first period and a straight line which indicates the second target value of the amount of power supplied from the grid in the second period are further drawn on the coordinate plane.

In the first feature, the second target value is changed at a different rate of change for each time of day, day, month, day of the week or season to which each timing of the second period belongs, and is set based on a history of the power supplied from the grid.

In the first feature, the first target value is a value set at each timing of the first period based on the target usage amount of power at the time of expiration of the first period.

In the first feature, the second target value is changed at a different rate of change for each time of day, day, month, day of the week or season to which each timing of the second period belongs, and is set based on a history of the power supplied from the grid.

In the first feature, the display apparatus includes: a control unit which expresses a coordinate of a current usage status of power supplied from the grid on the coordinate plane, based on a value of the amount of power supplied from the grid with respect to the first target value in the first period and a value of the amount of power supplied from the grid with respect to the second target value in the second period.

In the first feature, a straight line which indicates a prescribed upper limit of the amount of power supplied from the grid is further drawn on the coordinate plane.

A display system according to a second feature includes: a display apparatus that displays a usage status of power supplied from a grid; and a control apparatus that controls the display apparatus. The display apparatus includes: a display unit that displays an image of a coordinate indicating a current usage status of power supplied from a grid on a coordinate plane expressed by a first axis indicating a parameter which affects the basic rate and a second axis indicating a parameter which affects a metered power rate. The control apparatus: expresses the amount of power supplied from the grid in a first period on the first axis, and expresses the amount of power supplied from the grid in a second period which is different from the first period on the second axis.

A display method according to a third feature displays a usage status of power supplied from a grid. The display method includes: a step of displaying an image of a coordinate indicating a usage status of power supplied from the grid on a coordinate plane expressed by a first axis and a second axis. The first axis is an axis indicating a parameter which affects a basic rate and indicating amount of power supplied from the grid in a first period. The second axis is an axis indicating a parameter which affects a metered power rate and indicating amount of power supplied from the grid in a second period which is different from the first period.

According to the present invention, a display apparatus, a display system and a display method capable of providing appropriate information in a simple manner to a power customer.

BRIEF DESCRIPTION OF DRAWINGS

FIG. 4 is a diagram illustrating a display mode according to the first embodiment.

FIG. 5 is a diagram illustrating a display mode according to the first embodiment.

FIG. 6 is a diagram illustrating a display mode according to the first embodiment.

FIG. 7 is a flowchart illustrating a display method according to the first embodiment.

DESCRIPTION OF EMBODIMENTS

Figure 1:
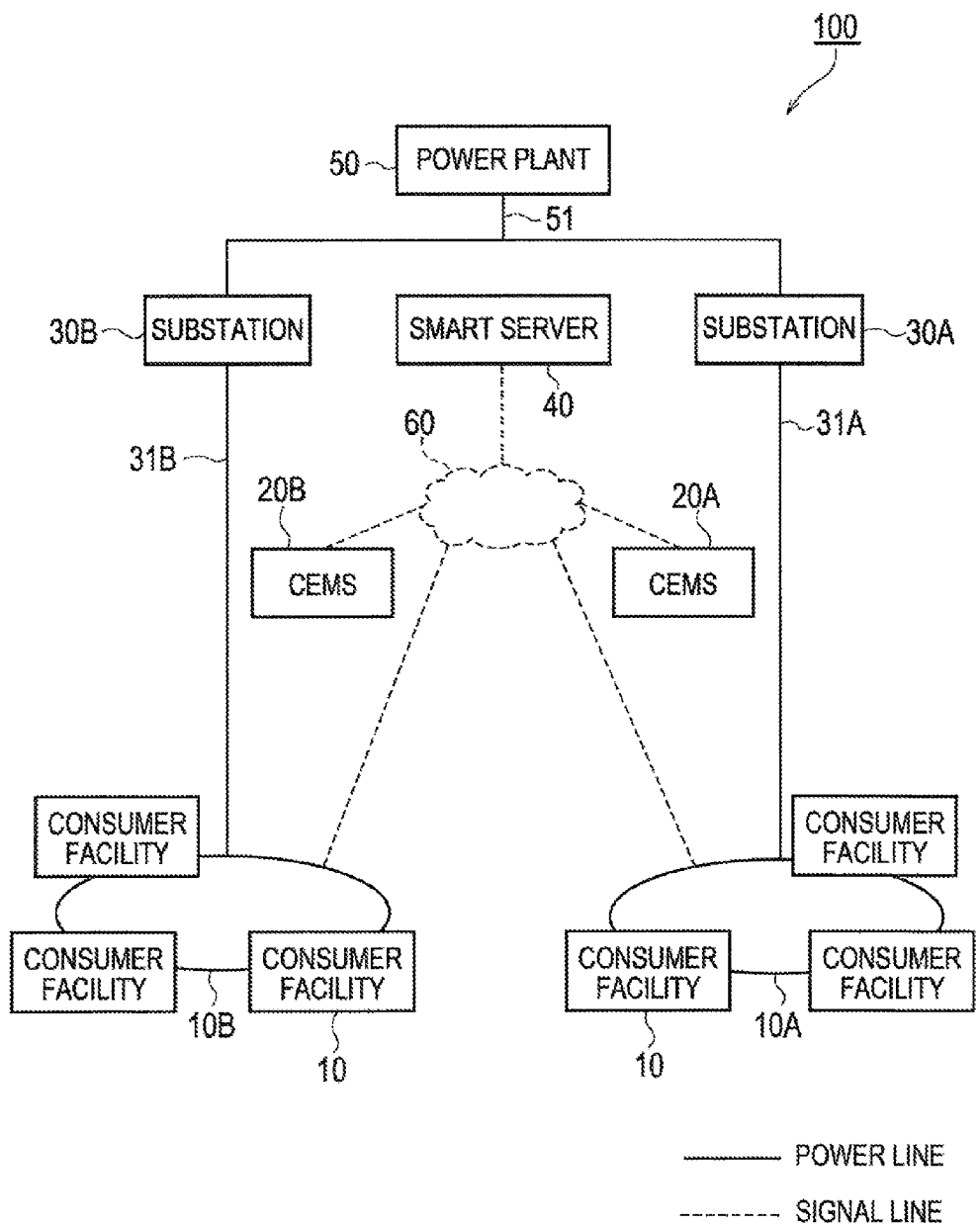
FIG. 1 is a diagram illustrating an energy management system 100 according to a first embodiment.

Hereinafter, an alert presentation apparatus and an alert presenting method according to an embodiment of the present invention will be described with reference to the drawings. In the following drawings, identical or similar components are denoted by identical or similar reference numerals.

It should be understood that the drawings are schematic only and the ratio of dimensions is not to scale. Therefore, specific dimensions should be determined with reference to the description below. It is needless to mention that different relationships and ratio of dimensions may be included in different drawings.

Outline of Embodiments

A display apparatus according to some embodiments displays a usage status of power supplied from a grid. The display apparatus includes: a display unit that displays an image of a coordinate indicating a current usage status of power supplied from the grid on a coordinate plane expressed by a first axis and a second axis. The first axis is an axis indicating a parameter which affects a basic rate and indicating amount of power supplied from the grid in a first period. The second axis is an axis indicating a parameter which affects a metered power rate and indicating amount of power supplied from the grid in a second period which is different from the first period.

In some embodiment, the display apparatus displays the image of the coordinate indicating the usage status of power supplied from a grid on the coordinate plane expressed by the first axis indicating the parameter which affects the basic rate and the second axis indicating the parameter which affects the metered power rate.

Therefore, even if a system to determine the power rate is a complicated system defined by two values: the basic rate and the metered power rate, it is possible to provide a power customer with a usage condition of power with respect to a current power rate in a simple manner.

First Embodiment (Energy Management System)

Hereinafter, an energy management system according to a first embodiment will be described. FIG. 1 is a diagram illustrating an energy management system 100 according to the first embodiment.

As illustrated in FIG. 1, the energy management system 100 is provided with a consumer facility 10, a CEMS 20, a substation 30, a smart server 40 and a power plant 50. The consumer facility 10, the CEMS 20, the substation 30 and the smart server 40 are connected via a network 60.

The consumer facility 10 is provided with, for example, a power generating apparatus and a power storage apparatus. The power generating apparatus is, for example, an apparatus which outputs power using fuel gas like a fuel cell. The power storage apparatus is, for example, an apparatus which stores power like a secondary battery.

The consumer facility 10 may be, for example, a residence such as a detached house, housing complex such as a condominium, a commercial institution such as a building, or a factory.

In the first embodiment, a consumer facility group 10A and a consumer facility group 10B are constituted by a plurality of consumer facilities 10. The consumer facility group 10A and the consumer facility group 10B are classified according to, for example, geographical areas.

The CEMS 20 controls interconnection between a plurality of consumer facilities 10 and a power system. Note that the CEMS 20 may be referred to as CEMS (Cluster/Community Energy Management System) because the CEMS 20 manages a plurality of consumer facilities 10. In particular, the CEMS 20 disconnects a plurality of consumer facilities 10 from the power system at the time of, for example, a power failure. On the other hand, the CEMS 20 performs interconnection between a plurality of consumer facilities 10 and the power system at the time of, for example, power return.

In the first embodiment, a CEMS 20A and a CEMS 20B are provided. The CEMS 20A controls, for example, interconnection between the consumer facilities 10 included in the consumer facility group 10A and the power system. The CEMS 20B controls, for example, interconnection between the consumer facilities 10 included in the consumer facility group 10B and the power system.

The substation 30 supplies a plurality of consumer facilities 10 with power via a distribution line 31. In particular, the substation 30 lowers a voltage supplied from the power plant 50.

In the first embodiment, a substation 30A and a substation 30B are provided. The substation 30A supplies power to, for example, the consumer facilities 10 included in the consumer facility group 10A via a distribution line 31A. The substation 30B supplies power to, for example, the consumer facilities 10 included in the consumer facility group 10B via a distribution line 31B.

The smart server 40 manages a plurality of CEMS 20 (here, the CEMS 20A and the CEMS 20B). Further, the smart server 40 manages a plurality of substations 30 (here, the substation 30A and the substation 30B). In other words, the smart server 40 collectively manages consumer facilities 10 included in the consumer facility group 10A and the consumer facility group 10B. The smart server 40 has, for example, a function to balance the power to be supplied to the consumer facility group 10A and the power to be supplied to the consumer facility group 10B.

The power plant 50 generates power by fire power, wind power, hydraulic power, atomic power and the like. The power plant 50 supplies a plurality of substations 30 (here, the substation 30A and the substation 30B) with power via a power line 51.

The network 60 is connected to each apparatus via a signal line. The network 60 is, for example, the Internet, a broadband communication network, a narrowband communication network, a portable telephone network, and the like.

(Consumer Facility)

Figure 2:
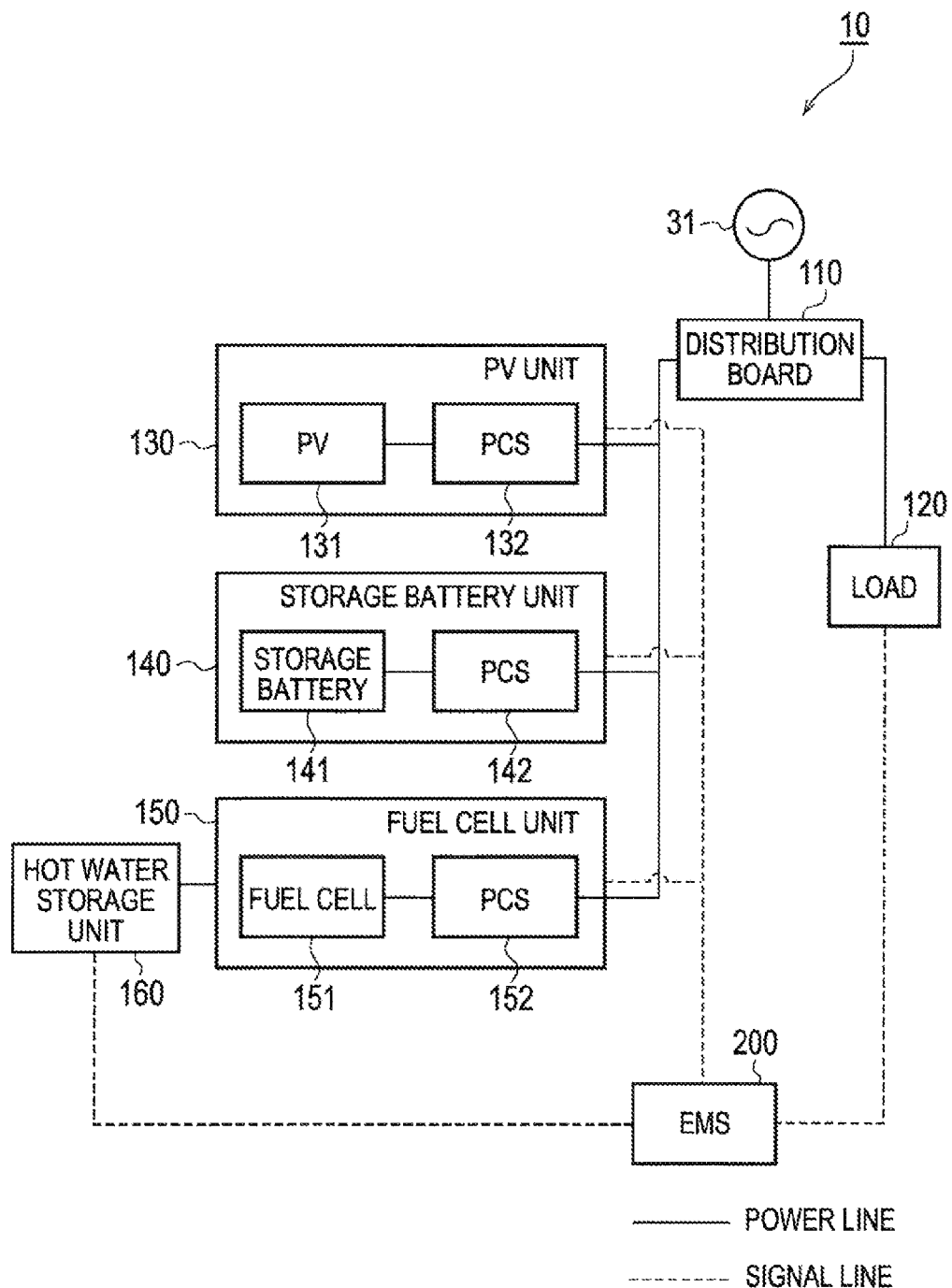
FIG. 2 is a diagram illustrating a consumer facility 10 according to the first embodiment.

Hereinafter, the consumer facility according to the first embodiment will be described. FIG. 2 is a diagram illustrating details of the consumer facility 10 according to the first embodiment.

As illustrated in FIG. 2, the consumer facility 10 is provided with a distribution board 110, a load 120, a PV unit 130, a storage battery unit 140, a fuel cell unit 150, a hot water storage unit 160 and the EMS 200.

The distribution board 110 is connected to the distribution line 31 (i.e., the grid). The distribution board 110 is connected to the load 120, the PV unit 130, the storage battery unit 140 and the fuel cell unit 150 via a power line.

The load 120 is an apparatus which consumes power supplied via the power line. For example, the load 120 includes an apparatus, such as a refrigerator, a lighting apparatus an air conditioner or a television. The load 120 may be a single apparatus or multiple apparatuses.

The PV unit 130 is provided with a PV 131 and a PCS 132. The PV 131 is an exemplary power generating apparatus, and is a photovoltaic power generating apparatus which generates power upon reception of sunlight. The PV 131 outputs generated DC power. An amount of generated power of the PV 131 changes depending on an amount of solar radiation with which the PV 131 is irradiated. The PCS 132 is an apparatus which converts DC power output from the PV 131 into AC power (i.e., a Power Conditioning System). The PCS 132 outputs the AC power to the distribution board 110 via the power line.

In the first embodiment, the PV unit 130 may be provided with a pyranometer for measuring the amount of solar radiation with which the PV 131 is irradiated.

The PV unit 130 is controlled by the MPPT (Maximum Power Point Tracking) method. In detail, the PV unit 130 optimizes an operating point of the PV 131 (i.e., a point defined by an operating point voltage value and the power value, or a point defined by the operating point voltage value and a current value).

The storage battery unit 140 is provided with a storage battery 141 and a PCS 142. The storage battery 141 is an apparatus which stores power. The PCS 142 is an apparatus (i.e., a Power Conditioning System) which converts AC power supplied from the distribution line 31 (i.e., the grid) into DC power. Further, the PCS 142 converts the DC power output from the storage battery 141 into AC power.

The fuel cell unit 150 is provided with a fuel cell 151 and a PCS 152. The fuel cell 151 is an exemplary power generating apparatus, and is an apparatus which outputs power using fuel gas. The fuel cell 151 is, for example, SOFC (Solid Oxide Fuel Cell) or PEFC (Polymer Electrolyte Fuel Cell). The PCS 152 is an apparatus (i.e., a Power Conditioning System) which converts DC power output from the fuel cell 151 into AC power.

The fuel cell unit 150 is operated by load following control. In detail, the fuel cell unit 150 controls the fuel cell 151 so that power output from the fuel cell 151 becomes the target power of the load following control.

The hot water storage unit 160 is an exemplary heat storage apparatus which converts power into heat, stores heat, or stores heat generated by a cogeneration apparatus, such as the fuel cell unit 150, as hot water. In particular, the hot water storage unit 160 is provided with a hot water storage tank and heats water supplied from the hot water storage tank with exhaust heat produced by operation (i.e., power generation) of the fuel cell 151. In detail, the hot water storage unit 160 heats water supplied from the hot water storage tank and flows back the heated hot water to the hot water storage tank.

The EMS 200 controls the PV unit 130, the storage battery unit 140, the fuel cell unit 150 and the hot water storage unit 160. In particular, the EMS 200 is connected to the PV unit 130, the storage battery unit 140, the fuel cell unit 150 and the hot water storage unit 160 via a signal line and controls the PV unit 130, the storage battery unit 140, the fuel cell unit 150 and the hot water storage unit 160. Further, the EMS 200 controls power consumption of the load 120 by controlling an operation mode of the load 120.

Further, the EMS 200 is connected to various servers via network 60. Various servers store information including, for example, a purchase unit price of the power supplied from the grid, a sales unit price of the power supplied from the grid and a purchase unit price of the fuel gas (hereafter, referred to as energy rate information).

Alternatively, various servers store information used for, for example, predicting power consumption of the load 120 (hereafter, referred to as energy consumption prediction information). The energy consumption prediction information may be, for example, generated based on a past actual value of power consumption of the load 120. Alternatively, the energy consumption prediction information may be a prescribed typical model value of power consumption of the load 120.

Alternatively, various servers store, for example, information used for predicting the amount of generated power of the PV 131 (hereafter, referred to as prediction information about the amount of generated PV power). The PV power generation prediction information may be a predicted value of the amount of solar radiation with which the PV 131 is irradiated. Alternatively, the PV power generation prediction information may be weather report, season, daylight hours and the like.

Figure 3:
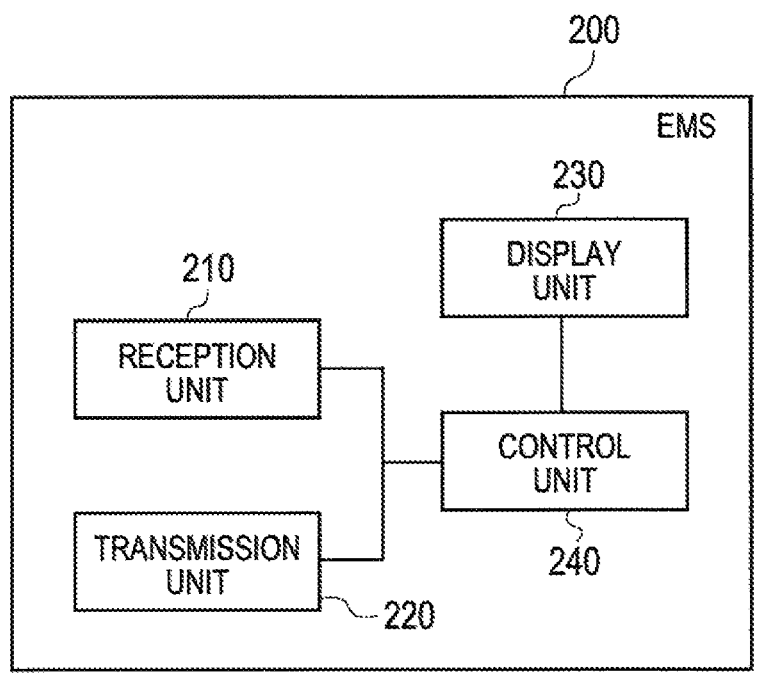
FIG. 3 is a diagram illustrating an EMS 200 according to the first embodiment.

In detail, as illustrated in FIG. 3, the EMS 200 is provided with a reception unit 210, a transmission unit 220, a display unit 230 and a control unit 240. In the first embodiment, the EMS 200 is an exemplary display apparatus.

The reception unit 210 receives various signals from the apparatuses connected via the signal line. For example, the reception unit 210 receives, from the PV unit 130, information which indicates an amount of generated power of the PV 131. The reception unit 210 receives, from the storage battery unit 140, information which indicates an amount of stored power of the storage battery 141. The reception unit 210 receives, from the fuel cell unit 150, information which indicates an amount of generated power of the fuel cell 151. The reception unit 210 receives, from the hot water storage unit 160, information which indicates an amount of stored hot water of the hot water storage unit 160.

In the first embodiment, the reception unit 210 may receive, from various servers, the energy rate information, the energy consumption prediction information and the prediction information about the amount of generated PV power via the network 60. However, the energy rate information, the energy consumption prediction information and the prediction information about the amount of generated PV power may be stored in the EMS 200 in advance.

The transmission unit 220 transmits various signals to the apparatuses connected via the signal line. For example, the transmission unit 220 transmits signals used to control the PV unit 130, the storage battery unit 140, the fuel cell unit 150 and the hot water storage unit 160 to each unit using a communication protocol, such as the ECHONET Lite or the ZigBee (registered trademark). The transmission unit 220 transmits, to the load 120, a control signal for controlling the load 120 using a communication protocol, such as the ECHONET Lite.

The display unit 230 displays an image of a coordinate indicating a usage status (hereafter, suitably referred to as a "power usage status") of power supplied from the grid on a coordinate plane expressed by the first axis and the second axis which perpendicularly cross each other. The first axis is an axis for indicating an amount of power (i.e., a usage amount of power) supplied from the grid in a first period (for example, 30 minutes) as a parameter which affects the basic rate.

The second axis is an axis for indicating an amount of power (i.e., a usage amount of power) supplied from the grid in a second period which is different from the first period (for example, one hour, one day, one week and one month) as a parameter which affects the metered power rate.

It is to be noted that, in the first embodiment, the total power rate is determined by two systems: the basic rate and the metered power rate. Here, an outline of a calculation process will be described.

First, the basic rate is defined based on an amount of power in a prescribed period (for example, 30 minutes) in the past. That is, an amount of power (i.e., a usage amount of power) in 30 minutes is measured using a maximum demand meter (i.e., a demand meter) connected to a distribution board 110. Then average power usage in the 30 minutes (kW) is calculated. The average power usage is referred to as a 30-minute demand value. Further the largest 30-minute demand value in one month is referred to as the maximum demand power (i.e., the maximum demand value) of the month. Then, the largest value in the maximum demand value of the month or the maximum demand value in the past one year is used for calculation of the basic rate. That is, if once a large demand value is caused in one month or one year, the basic rate using the demand value will be applied to the next month or to the next year. The basic rate is defined in this manner.

On the other hand, the metered power rate is defined based on the usage amount of power in the calculation target period (generally, one month or one year). That is, the metered power rate in the calculation target period is a meter-rate charge.

The first period which affects the basic rate is, for example, 30 minutes and the second period which affects the metered power rate is, for example, one month or one year and the first period and the second period are different in time length.

Here, since the first period and the second period differ from each other, it should be noted that update timing of the coordinate on the first axis differs from update timing of the coordinate on the second axis.

In the first embodiment, the second period may be selectable by the power customer. In such a case, the display unit 230 may display an image of a coordinate indicating a usage status of power supplied from the grid using the second axis defined in the second period selected by the power customer.

In the first embodiment, the display unit 230 may display an image illustrating a transition of an amount of power supplied from the grid based on a history of power supplied from the grid. For example, the image illustrating the transition of the amount of power supplied from the grid is an image illustrating a direction (i.e., a vector) in which amount of power supplied from the grid is changed. The image illustrating a transition of an amount of power supplied from the grid may be an image illustrating an amount (i.e., a size of a vector) in which amount of power supplied from the grid is changed per unit time (for example, 5 minutes).

In the first embodiment, the display unit 230 may display a coordinate plane by providing different colors at least to a position corresponding to a first quadrant and at least to a position corresponding to a third quadrant on the coordinate plane. For example, when the first quadrant is a quadrant indicating a favorable state (that is, a state in which the usage amount of power is small), the display unit 230 provides a cold color (for example, blue or green) at a position corresponding to the first quadrant. When the third quadrant is a quadrant indicating a worsened state (that is, a state in which the usage amount of power is large), the display unit 230 provides a warm color (for example, red or yellow) at a position corresponding to the third quadrant. The display unit 230 may provide the color with gradation from the first quadrant toward the third quadrant.

In the first embodiment, the first axis and the second axis may cross each other on a coordinate which indicates a first target value of the amount of power supplied from the grid in the first period and a second target value of the amount of power supplied from the grid in the second period. Alternatively, a straight line indicating the first target value of the amount of power supplied from the grid in the first period and a straight line indicating the second target value of the amount of power supplied from the grid in the second period may further be drawn on the coordinate plane expressed by the first axis and the second axis.

The control unit 240 controls the load 120, the PV unit 130, the storage battery unit 140, the fuel cell unit 150 and the hot water storage unit 160.

In the first embodiment, the control unit 240 stores the amount of power (i.e., the usage amount of power) supplied from the grid. In particular, the control unit 240 separately stores a usage amount of power about the first axis (hereafter, suitably referred to as a "first usage amount of power") and a usage amount of power about the second axis (hereafter, suitably referred to as a "second usage amount of power"). The control unit 240 resets the first usage amount of power for each first period (for example, 30 minutes). Similarly, the control unit 240 resets the second usage amount of power for each second period (for example, one month).

Based on the first usage amount of power and the second usage amount of power, the control unit 240 makes the display unit 230 display an image of a coordinate indicating a usage status of power supplied from the grid. Here, the control unit 240 expresses, as the coordinate of the power usage status, a coordinate indicated by the first usage amount of power with respect to the first target value and the second usage amount of power expresses with respect to the second target value. The first usage amount of power with respect to the first target value is, for example, a value obtained by subtracting the first usage amount of power from the first target value at each timing in the first period. The second usage amount of power with respect to the second target value is, for example, a value obtained by subtracting the second usage amount of power from the second target value at each timing in the second period. For example, depending on an update period of the image displayed by the display unit 230, the control unit 240 calculates the first usage amount of power with respect to the first target value and the second usage amount of power with respect to the second target value, and expresses a coordinate indicating power usage status on the coordinate plane.

The control unit 240 calculates the first target value and the second target value. The first target value is a target value of the usage amount of power at each timing of the first period and, for example, is a value calculated based on a value obtained by subtracting a prescribed margin from a threshold of the usage amount of power at which the basic rate is increased in the future (i.e., a target usage amount of power at the time of first period expiration). The first target value increases depending on elapsed time from the start of the first period. For example, the first target value may change (i.e., increase) in proportion to the elapsed time from the start of the first period or may change (i.e., increase) temporally with a different rate of change at a first half and a second half of the first period.

The second target value is a target value of a usage amount of power at each timing of the second period and, for example, is a value calculated based on an average value of histories (i.e., the amount of power) of the power supplied from the grid. The second target value increases depending on the elapsed time from the start of the second period. For example, the second target value changes (i.e., increases) in proportion to the elapsed time from the start of the second period. Alternatively, the second target value may change (i.e., increase) temporally at a different rate of change for each time of day, day, month, day of the week or season to which each timing of the second period belongs.

(Display Form)

Hereinafter, a display form according to the first embodiment will be described. FIGS. 4 to 6 are diagrams illustrating a display mode according to the first embodiment.

As illustrated in FIG. 4, on a coordinate plane expressed by the first axis and the second axis, the display unit 230 displays a character image, as an image of a coordinate indicating usage status of power supplied from the grid, on the coordinate expressed based on the first usage amount of power and the second usage amount of power. Further, the display unit 230 displays an image illustrating the character going up and down the stairs as an image illustrating a transition of the amount of power supplied from the grid.

For example, when the power usage status tends to be a favorable state (that is, a state in which the usage amount of power is small), an image in which the character is facing upper right direction of the drawing and going upstairs is displayed. When the power usage status is worsened (that is, a state in which the usage amount of power is large), an image in which the character falls down the stairs in the lower left direction of the drawing is displayed.

Here, the control unit 240 expresses a coordinate indicating a power usage status on a coordinate plane by the first usage amount of power with respect to the first target value and the second usage amount of power with respect to the second target value at each timing.

For example, as illustrated in FIG. 4, in a case in which the first axis and the second axis cross each other on a coordinate indicating the first target value and the second target value, when the first usage amount of power becomes lower than the first target value, the coordinate of the first axis indicates a positive value and, when the first usage amount of power becomes higher than the first target value, the coordinate of the first axis indicates a negative value. When the second usage amount of power becomes lower than the second target value, the coordinate of the second axis indicates a positive value and, when the second usage amount of power becomes higher than the second target value, the coordinate of the second axis indicates a negative value.

That is, when both the first usage amount of power and the second usage amount of power are lower than the target value, the coordinate which indicates the usage amount of power status is located in the first quadrant indicating a favorable state. On the other hand, when both the first usage amount of power and the second usage amount of power are higher than the target value, the coordinate which indicates the power usage status is located in the third quadrant indicating a worsened state. When one of the first usage amount of power or the second usage amount of power is lower than the target value and the other is higher than the target value, the coordinate which indicates the power usage status is located in the second quadrant or the fourth quadrant.

Alternatively, as shown in FIG. 5, on the coordinate plane expressed by the first axis and the second axis, a character image is displayed on the coordinate which indicates the first usage amount of power and the second usage amount of power as an image of the coordinate which indicates the usage status of power supplied from the grid. Further, an index ">" indicating a direction as an image illustrating a transition of the amount of power supplied from the grid is displayed.

Here, the direction of the index ">" indicates the direction (i.e., the vector) in which the amount of power supplied from the grid changes. The number of indices ">" indicates an amount (i.e., the size of the vector) in which the amount of power supplied from the grid changes in a unit time (for example, 5 minutes).

Alternatively, as shown in FIG. 6, on the coordinate plane expressed by the first axis and the second axis, a character image is displayed on the coordinate expressed based on the first usage amount of power and the second usage amount of power as an image of a coordinate indicating a usage status of power supplied from the grid. Further, an index "→" indicating a direction is displayed as an image illustrating a transition of the amount of power supplied from the grid.

Here, a direction of index "→" indicates a direction (i.e., a vector) in which the amount of power supplied from the grid changes. A length of the index "→" indicates an amount (i.e., a size of the vector) in which the amount of power supplied from the grid changes in a unit time (for example, 5 minutes).

In FIGS. 4 to 6, it is desirable that a cold color is provided in a position corresponding to the first quadrant and a warm color is provided in a position corresponding to the third quadrant. Then the first axis and the second axis may cross each other at a coordinate indicating the target value in each of the first axis and the second axis, or a straight line indicating the target value in each axis may further be drawn. By illustrating such a target value, a current status with respect to the target value becomes obvious.

(Display Method)

Hereinafter, a display method according to the first embodiment will be described. FIG. 11 is a flowchart illustrating the display method according to the first embodiment. It is to be noted that the flowchart illustrated in FIG. 7 is repeated at a prescribed period (for example, 1 minute). The prescribed period is the update period of the image displayed by the display unit 230.

As illustrated in FIG. 7, in step S10, the EMS 200 stores power (i.e., a usage amount of power) supplied from the grid.

In step S20, the EMS 200 determines whether the first period has elapsed after the coordinate on the first axis is updated. If the determination result is "YES," the EMS 200 proceeds to a process of step S30. If the determination result is "NO," the EMS 200 proceeds to a process of step S40.

In step S30, the EMS 200 resets the first usage amount of power.

In step S40, the EMS 200 determines whether the second period has elapsed after the coordinate on the second axis is updated. If the determination result is "YES," the EMS 200 proceeds to a process of step S30. If the determination result is "NO," the EMS 200 proceeds to a process of step S40.

In step S50, the EMS 200 resets the second usage amount of power.

In step S60, the EMS 200 updates the image displayed by the display unit 230. That is, on the coordinate plane expressed by the first axis and the second axis, the EMS 200 displays (updates) an image of the coordinate indicating the usage status of power supplied from the grid.

As described above, in the first embodiment, on a coordinate plane expressed by a first axis indicating a parameter which affects the basic rate and a second axis indicating a parameter which affects a metered power rate, the EMS 200 displays an image of a coordinate indicating a usage status of power supplied from a grid.

Therefore, even if a system to determine the power rate is a complicated system defined by the basic rate and the metered power rate, it is possible to provide a power customer with a usage condition of power with respect to a current power rate in a simple manner.

Therefore, the power customer can properly manage the usage amount of power supplied from the grid by, for example, controlling the power consumption of the load 120. Similarly, the power customer can properly set operation modes of the storage battery unit 140 and the fuel cell unit 150.

By the way, although an example in which the target values of each of the first axis and the second axis are indicated has been described above, it is also possible to further draw an upper limit power value on the coordinate plane. In Japan, for example, in a case of a high-voltage power user, an upper limit of maximum demand power (i.e., the maximum demand value) is determined by contract with an electric power company. When the upper limit power is exceeded, it is necessary to pay extra penalty. Therefore, if a straight line which indicates a contract upper limit is displayed on the coordinate plane, the consumer facility is encouraged to use the power so as not to exceed the limit, which leads the reduction of occurrence of penalty. The straight line which indicates the contract upper limit is drawn to correspond to the first period when an upper limit value is set to the maximum demand value and is drawn to correspond to the second period when an upper limit is set to the usage amount, such as a month or a year.

Modification

Hereinafter, Modification of the first embodiment will be described. Hereinafter, differences between the first embodiment and Modification will be mainly described.

In the first embodiment, a case in which the display apparatus is provided in the EMS 200 has been described. In Modification, in contrast to the first embodiment, the display apparatus is a personal computer, a smartphone, a tablet terminal or the like capable of communicating with the EMS 200. In such a case, the display apparatus displays a usage status of power supplied from the grid by the control of the EMS 200.

Other Embodiment

Although the present invention has been described with reference to the embodiment described above, it should not be understood that the discussion and drawings constituting a part of the disclosure are limiting the present invention. Various alternative embodiments, examples and operation technology will be apparent to a person skilled in the art from the present disclosure.

The EMS 200 may be a SEMS (Store Energy Management System), a BEMS (Building Energy Management System) or a FEMS (Factory Energy Management System). The EMS 200 may also be a HEMS (Home Energy Management System).

As described above, as for the present invention, it is needless to mention that various embodiments that are not described here are included. Moreover, it is also possible to combine the above-described embodiments and modifications. Accordingly, the technical range of the present invention is to be defined only by the inventive specific matter according to the adequate claims from the above description.

It is noted that the entire content of Japan Patent Application No. 2012-113869 (filed on May 17, 2012) is incorporated in the present application by reference.

INDUSTRIAL APPLICABILITY

According to the present invention, a display apparatus, a display system and a display method capable of providing appropriate information in a simple manner to a power customer.

The invention claimed is:

1. A display apparatus which displays a usage status of power supplied from a grid, comprising:
   a display, and
   a controller configured to control the display to display a first image indicating a coordinate space expressed by a first coordinate axis and a second coordinate axis crossing each other, wherein
   the first coordinate axis is a coordinate axis for specifying a magnitude of a first power amount supplied from the grid in a first period,
   the second coordinate axis is a coordinate axis for specifying a magnitude of a second power amount supplied from the grid in a second period different from the first period,
   the first power amount corresponds to a basic rate for receiving a power supply service,
   the second power amount corresponds to a metered rate for receiving the power supply service,
   the controller is further configured to display a second image with the first image, the second image indicating the first and second power amount at a current time in the said coordinate space, and
   wherein the controller controls power consumption of a load in accordance with the displayed usage status of power supplied from the grid.

2. The display apparatus according to claim 1, wherein a period of the second period is selectable, and the controller controls the display to display the second power amount in the period selected as the second period using the second axis.

3. The display apparatus according to claim 1, wherein the controller controls the display to display an image illustrating a transition of the first power amount and the second bower amount as the second image based on a history of the power supplied from the grid.

4. The display apparatus according to claim 1, wherein the controller controls the display to display the coordinate plane so as to provide different colors for a portion corresponding to a first quadrant and a portion corresponding to a third quadrant on the coordinate plane at the least.

5. The display apparatus according to claim 1,
wherein the first axis and the second axis cross each other on a coordinate which indicates a first target value of the first power amount and a second target value of the second power amount.

6. The display apparatus according to claim 5, wherein the first target value is a value set at each timing of the first period based on the target usage amount of power at the time of expiration of the first period.

7. The display apparatus according to claim 5, wherein the second target value is changed at a different rate of change for each time of day, day, month, day of the week or season to which each timing of the second period belongs, and is set based on a history of the power supplied from the grid.

8. The display apparatus according to claim 1, wherein a straight line which indicates a first target value of the first power amount and a straight line which indicates a second target value of the second power amount are further drawn on the coordinate plane.

9. The display apparatus according to claim 1, wherein the basic rate is calculated from a maximum demand value which is a largest demand value selected from demand values summed up for respective first time period.

10. A display system comprising:
a display apparatus that displays a usage status of power supplied from a grid; and
a control apparatus that controls the display apparatus, wherein the display apparatus comprises:
   a display,
   a controller configured to control the display to display a first image indicating a coordinate space expressed by a first coordinate axis and a second coordinate axis crossing each other, wherein
   the first coordinate axis is a coordinate axis for specifying a magnitude of a first power amount supplied from the grid in a first period,
   the second coordinate axis is a coordinate axis for specifying a magnitude of a second power amount supplied from the grid in a second period different from the first period,
   the first power amount corresponds to a basic rate for receiving a power supply service,
   the second power amount corresponds to a metered rate for receiving the power supply service, and
   the controller is further configured to display a second image with the first image, the second image indicating the first and second power amount at a current time in the said coordinate space, and
wherein the control apparatus controls power consumption of a load in accordance with the displayed usage status of power supplied from the grid.

11. The display system according to claim 10, wherein the basic rate is calculated from a maximum demand value which is a largest demand value selected from demand values summed up for respective first time period.

12. A method comprising:
displaying a first image indicating a coordinate space expressed by a first coordinate axis and a second coordinate axis crossing each other, wherein
   the first coordinate axis is a coordinate axis for specifying a magnitude of a first power amount supplied from the grid in a first period,
   the second coordinate axis is a coordinate axis for specifying a magnitude of a second power amount supplied from the grid in a second period different from the first period,
   the first power amount corresponds to a basic rate for receiving a power supply service,
   the second power amount corresponds to a metered rate for receiving the power supply service, and
displaying a second image with the first image, the second image indicating the first and second power amount at a current time in the said coordinate space, and
controlling power consumption of a load in accordance with the displayed usage status of power supplied from the grid.

13. The display method according to claim 12, wherein the basic rate is calculated from a maximum demand value which is a largest demand value selected from demand values summed up for respective first time period.

* * * * *